US009183930B2

(12) United States Patent
Perniola

(10) Patent No.: US 9,183,930 B2
(45) Date of Patent: Nov. 10, 2015

(54) METHOD OF PROGRAMMING A NON-VOLATILE RESISTIVE MEMORY

(71) Applicant: COMMISSARIAT A L'ENERGIE ATOMIQUE ET AUX ENE ALT, Paris (FR)

(72) Inventor: Luca Perniola, Noyarey (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/175,320

(22) Filed: Feb. 7, 2014

(65) Prior Publication Data

US 2014/0254240 A1   Sep. 11, 2014

(30) Foreign Application Priority Data

Feb. 8, 2013   (FR) ...................... 13 51093

(51) Int. Cl.
*G11C 11/00* (2006.01)
*G11C 13/00* (2006.01)

(52) U.S. Cl.
CPC ........ *G11C 13/0069* (2013.01); *G11C 13/0007* (2013.01); *G11C 2013/0083* (2013.01)

(58) Field of Classification Search
CPC .................................................. G11C 13/0007
USPC ......................................................... 365/148
See application file for complete search history.

(56) References Cited

U.S. PATENT DOCUMENTS

| 7,826,247 | B2 * | 11/2010 | Muraoka et al. ............. 365/148 |
| 8,488,362 | B2 * | 7/2013 | Lee et al. ...................... 365/148 |
| 2005/0158950 | A1 | 7/2005 | Scheuerlein et al. |
| 2009/0237985 | A1 | 9/2009 | Matsuzaki et al. |
| 2011/0317480 | A1 | 12/2011 | Lung et al. |
| 2012/0081946 | A1 | 4/2012 | Kawabata et al. |
| 2012/0300532 | A1 * | 11/2012 | Yamazaki et al. ............ 365/148 |
| 2013/0044534 | A1 * | 2/2013 | Kawai et al. .................. 365/148 |
| 2014/0192585 | A1 * | 7/2014 | Hashim et al. ................ 365/148 |

FOREIGN PATENT DOCUMENTS

| WO | 2006/078505 A2 | 7/2006 |
| WO | 2007/141865 A1 | 12/2007 |

OTHER PUBLICATIONS

U.S. Appl. No. 14/175,292, filed Feb. 7, 2014, Perniola.

(Continued)

*Primary Examiner* — Son Mai
(74) *Attorney, Agent, or Firm* — Oblon, McClelland, Maier & Neustadt, L.L.P.

(57) ABSTRACT

A method for pre-programming a matrix of resistive non-volatile memory cells, the cells including a dielectric material between two conducting electrodes and being initially in an original resistive state, the dielectric material being electrically modified to bring a cell from the original state to another resistive state wherein the resistance of the cell is at least twice and preferably at least ten times lower than the resistance of the cell in the original state. The method includes, prior to mounting a component containing the matrix on a support, programming the matrix by electrically bringing cells from the original state to the other state, leaving the other cells in their original state, and after mounting the component, applying to all the cells an intermediate voltage, to keep in the original state the cells in this state and returning or keeping to/in another state the cells not in the original state.

22 Claims, 4 Drawing Sheets

(56) References Cited

OTHER PUBLICATIONS

French Preliminary Search Report and Written Opinion issued Oct. 15, 2013, in Patent Application No. FR 1351093, filed Feb. 8, 2013 (with English Translation of Category of Cited Documents).

French Preliminary Search Report and Written Opinion issued Oct. 9, 2013, in Patent Application No. FR 1351094, filed Feb. 8, 2013 (with English Translation of Category of Cited Documents).

French Preliminary Search Report and Written Opinion issued Oct. 16, 2013, in Patent Application No. FR 1351095, filed Feb. 8, 2013 (with English Translation of Category of Cited Documents).

* cited by examiner

METHOD OF PROGRAMMING A NON-VOLATILE RESISTIVE MEMORY

TECHNICAL FIELD OF THE INVENTION

The present invention relates, in general, to resistive non-volatile memories, and more particularly to resistive memories which may be used within the scope of an industrial process for manufacturing embedded systems wherein such memories can advantageously be pre-programmed in their production environment without the stored data being lost afterwards because of the heat constraints, and more particularly mounting constraints, which they are exposed to during the steps of welding or reflow soldering of the components. The invention more particularly relates to a method for programming resistive memory cells and a method of manufacturing an electronic component integrating a matrix of resistive memory cells.

STATE OF THE ART

In addition to electronic, optical or mechanical elements belonging to each system, computer embedded systems always use microprocessors or micro-controllers and electronic memories required for ensuring the operation thereof. Typically, all the components which compose an embedded system are mounted on one or more printed circuit(s) or electronic card(s), which are often also called PCB, i.e. "printed circuit board(s)". Mounting is generally automatized, in a production line. The electronic components are most often in the form of components intended to be surface-mounted (without any through-type insert). Then they are simply positioned on the printed circuit by a positioning machine. Welding or brazing paste shall have been deposited beforehand onto the terminals of the components and/or of the printed circuit. The printed circuit whereon the components are positioned is then placed in a heating furnace, typically a so-called tunnel furnace, wherein the temperature gradient is so adjusted as to melt the deposited paste, which provides, when cooled, a mechanical fixing of the components and an excellent electrical contact. This standard manufacturing operation of a printed circuit is called reflow brazing or soldering, in the technical literature.

At least a part of the memories composing an embedded system is nearly always of the non volatile type. For example, to be able to permanently store therein the operational code, also called the microcode, of the micro-processor(s) or micro-controller(s) which is/are used for providing the function which the embedded system has been designed for. Usual practice consists in the manufacturing process requesting that the non volatile part of the memories can be programmed prior to mounting onto the printed circuit. A very significant advantage of this procedure is that a specific code intended to test the printed circuit as soon as it is mounted, in order to check the integrity thereof, can for instance be pre-programmed in the non volatile part. Another exemplary advantage related to the possibility of pre-programming the non volatile memories relates to secure chip cards, also called "secure smart cards". The issuers of such cards, such as banks, prefer the confidential data they contain to be introduced prior to mounting, so that they don't have to check the distribution of such sensitive information beyond the manufacturing line.

If the operation code or the functional data the non volatile memory must contain have not been pre-programmed, they must be loaded in situ, i.e. into the non volatile memory after assembling thereof, and after the connexion thereof with the other components on the printed circuit. Means have long been developed by the micro-electronics industry to provide this function after mounting. A usual practice consists in using the tests circuits which are contained in nearly all the circuits developed by this industry, more particularly the so-called JTAG ("Joint Test Action Group") circuits, which refers to a workgroup which enabled to define a strategy and means for testing printed circuits as from the mid eighties, in order to check the correct operation of ever more complex circuits. As a standard, the JTAG circuits make it possible to individually access the components mounted on a printed circuit through a specialized series interface which can also enable an in-situ programming of the non volatile part of the memory. The intrinsically small access time and the limited available bandwidth of this method result in the code loading being a very long operation which may slow down the manufacturing line.

Other means have been provided for the in-situ programming of the non volatile part of the memories which have their own disadvantages such as requiring specialized connection points which will have no functional utility and/or an interface dedicated to such function in order to enable, on the one hand, the writing of a code into the non volatile part of the memory, and, on the other hand, the controlling of the other components so that these can be inhibited, so as not to interfere with the code loading. This, of course, significantly complicates the design of the embedded system and also generally requires the development of a specialized programming tool for loading the code after mounting in the manufacturing line.

Whenever possible, the whole code, i.e. not only the test code, but also the functional code, is preferably loaded prior to mounting. This avoids an in-situ programming with all the drawbacks briefly mentioned above.

The presently used non volatile memories are mainly so-called Flash memories, wherein each memory point is a Metal Oxide semiconductor (MOS) having a floating grid wherein carriers are trapped. Programming such memories is executed by applying to the electrodes higher voltages than those used for reading same. Such voltages make it possible to bring charges into the floating grid, or to evacuate them therefrom, in order to permanently modify, when reading, the conduction threshold of the transistor, so as to be able to store at least two different electric levels, i.e. an information bit therein. Carriers are trapped and evacuated through the very thin oxide layer forming the grid of the MOS transistor by implementing quantal effects of the tunnelling effect or hot electron types. This type of non volatile storage is not particularly affected by temperature. Flash memories are not at all affected by the programming prior to mounting. Their contents is not affected by the reflow soldering operation described above, wherein the maximum temperature reached is typically about 245° C. for the soldering pastes containing lead. Using unleaded pastes, as required now for their not polluting property, increases temperature up to 260° C., even higher, which still has no negative effect on the retention of the data pre-programmed in this type of memory. The main disadvantage of the Flash memories is that the programming thereof requires, as mentioned above, applying significant voltages and currents to transfer charges into or from the floating grid. Writing therein is a relatively slow and complicated operation which may have to be carried out, depending on the internal structure thereof, of the so-called AND or OR types, on cell blocks which have to be erased prior to re-writing new data.

This is the reason why the designers of embedded systems now prefer using other types of non volatile memories which have none of these drawbacks. This more particularly concerns so-called "resistive" memories, which are globally called RRAM ("Resistive Random Access Memory") memories, wherein storage is obtained by reversibly electrically modifying the material composing each cell so that it can take at least two different resistance values, in order to store an information bit therein. Among the various types of existing resistive memories, those which are based on a normally insulating dielectric material are more particularly considered. Such memories, which are called OxRAM, a term which refers to the use of an oxide (Ox) as the dielectric material, implement an operation mode wherein at least a conducting filament, can be provided between two electrodes separated by the oxide, after the application of a sufficiently high voltage therebetween. When the filament has been formed, a low resistance state, generally called LRS, is obtained. This state may be reversed by a so-called "RESET" operation, in order to bring the memory back into a second high resistance state, or HRS, with the filaments being broken during such operation. When the filament has been formed for the first time, a so-called "SET" operation can bring the memory back again into a low resistance state, or LRS, by reforming at least one filament.

However, unlike the high resistance state, the state in a low resistance where at least a conducting filament is formed is thermally unstable. The service life of the conducting filaments, and thus the retention time of the information stored in this form, very quickly decreases with the increase in the temperature which they are exposed to. For the maximum temperature of 260° C. mentioned above, which is sustainably reached during a reflow soldering, the retention time can then be insufficient to reliably guarantee the retention of the information programmed therein beforehand. The resistive memories of the RRAM type thus cannot be usefully pre-programmed prior to mounting since the stored information will be lost during the reflow soldering operation.

Document US2012081946 disclosed a solution wherein a highly resistive state obtained by programming the cell is used.

It would then be particularly advantageous to have memory cells with a high integration density, at least similar to, or event greater than the above-mentioned Flash memories, which would also be able to retain information at relatively high temperatures. The present invention aims at reaching this object.

Another object of the invention is also to provide a solution to enable a memory cell not to lose a programming carried out beforehand during a mounting operation.

Other purposes, characteristics and advantages of this invention will become apparent upon examination of the following description and accompanying drawings. It is understood that other advantages can be included.

SUMMARY OF THE INVENTION

A method for pre-programming a matrix of resistive non-volatile memory cells, with said memory cells comprising a dielectric material positioned between two conducting electrodes, with said memory cells being initially in an original resistive state (original HRS) and the dielectric material being able to be so electrically modified as to bring the memory cell from the original resistive state (original HRS) to at least another resistive state (LRS, programmed HRS), also called a pre-programming resistive state, wherein the resistance of the memory cell is at least twice and preferably at least ten times lower than the resistance of the memory cell in the original resistive state (original HRS), at least for a reading voltage interval, characterized in that the method comprises the following steps:

prior to mounting a component containing said matrix on a support: programming the matrix by electrically bringing a plurality of cells from the original resistive state (original HRS) to said other resistive state (LRS, programmed HRS); leaving the other memory cells in their resistive state (original HRS).

It turns out that the original resistive state (original HRS) remains stable even when the cell receives a significant quantity of heat caused by the step of mounting which includes, for instance, a step of welding or of brazing. After mounting, the cells left in the original resistive state after programming remain in this state. On the other hand, the cells electrically brought from the original resistive state (original HRS) to the other resistive state (LRS, programmed HRS) may be affected by the additional heat from the step of mounting and their resistive state may be modified. However, these cells, even highly altered, never go back to their original resistive state.

The invention thus makes it possible to differentiate, after mounting:
the cells which have not been programmed prior to mounting. Such cells remain in the original resistive cell after mounting, with respect to the cells which have been programmed prior to mounting. Such cells may have been altered by mounting, but in any event, they are not in the original resistive state. Such cells are thus all the cells which are not in the original resistive state.

The invention then provides for a simple and strong solution to retrieve the programming of a matrix of resistive non-volatile memory cells after a step of mounting during which a high thermal stress is applied to the matrix.

Preferably and advantageously the method comprises the following step, after mounting the component containing said matrix on the support:
applying, preferably to all the cells in the matrix an intermediate voltage, also called a control voltage, with said intermediate voltage being:
  lower than a first range of voltages having a value high enough to be able to bring a memory cell from the original resistive state (original HRS) to a second resistive state (LRS) wherein the resistance of the memory cell is at least twice, and preferably at least ten times lower than the resistance of the memory cell in the original resistive cell (original HRS),
  higher than a second range of voltages having values lower than the first range but high enough to be able to bring a memory cell which is not in the original resistive state (original HRS) to said second resistive state (LRS),
with the first and second ranges of voltage being separated.

Then, after applying the intermediate voltage to all the cells in the matrix, the cells which had been left in their original resistive state (original HRS) will not be affected since the intermediate voltage is not high enough to change such state. On the contrary, by applying the intermediate voltage to the cells which had been programmed by being brought to another state (LRS, programmed HRS), less resistive than the original resistive state (original HRS) and which had been altered by the application of a high temperature during mounting, will bring these, or return these to the second resistive state (LRS). These cells may, for instance be cells wherein a conducting filament had already been formed during pre-programming and wherein such filament has been partially broken under the effect of the additional heat generated by the step of mounting. Applying the intermediate voltage will make it possible to re-form the unintentionally broken filaments. Besides, the cells which had been made conducting (or at least resistive) during the step of programming and which had remained in the second resistive state, i.e. the conducting or less resistive state (LRS) in spite of the additional heat will remain in this second resistive state (LRS). Applying the intermediate voltage will not bring such cells to a non conducting state.

The invention then provides for a simple and strong solution to retrieve the programming of a matrix of resistive non-volatile memory cells after a step of mounting during which a high thermal stress is applied to the matrix.

The invention thus makes it possible to reach high integration densities of the matrices of memory cells and to increase the strength thereof when exposed to a thermal stress.

Besides, the invention makes it possible to correct the information in the cells affected by the additional heat without however requiring to know the state of each cell prior to mounting and after programming. The invention thus makes it possible to do without a step of reading each cell. The invention thus makes it possible to significantly reduce the processing time by applying the control voltage on all the cells whatever the state prior to mounting the cell.

Generally, the original resistive state (original HRS) i.e., the non original conducting state is the state obtained upon completion of the memory cell production process and which has not been altered by any programming current.

Optionally, the process according to the invention may also comprise at least any one of the following characteristics and steps:

According to one embodiment, the current flowing through the two conducting electrodes goes through the dielectric material. Preferably, the whole current flowing from one conducting electrode to the other one necessarily goes through the dielectric material.

According to one embodiment, the dielectric material is in contact with each one of the two conducting electrodes. Preferably, only the dielectric material is in contact with each one of the two conducting electrodes. Thus, no other material is present between the two conducting electrodes in the current flow. No other material is preferably present between the two conducting electrodes. More particularly, no phase-change material is present between the two conducting electrodes. More generally, the resistive cell comprises no phase-change material.

Advantageously, the first and second ranges of voltage are separated by an intermediate interval of values. Preferably, the matrix of memory cells is so selected that said intermediate interval of values is higher than or equal to 100 millivolts and preferably at least 200 millivolts. Preferably, the matrix of memory cells is so selected that said intermediate interval of values is higher than or equal to 500 millivolts.

Advantageously, the intermediate voltage is so selected as to be as high as possible within said intermediate interval of values.

Advantageously, during the step of mounting, the memory cells are exposed to a temperature of at least 240° C. Advantageously, the step of mounting comprises applying to the matrix a temperature higher than or equal to 240° C. for at least 10 seconds and preferably at least 260 degrees Celsius for at least 10 seconds.

Preferably, the step of mounting the component containing said matrix on the support comprises mounting the component onto a printed card, an electronic card, another electronic component or a box.

Advantageously, the step of mounting comprises a step of brazing or welding of the component on the support or a process of the WLCSP type (the acronym for Wafer Level Chip Scale Packages), which is translated in French by "procèdè de rèalisation d'un boitier à la taille d'une puce au niveau du substrat".

Preferably, the step of mounting comprises a step of brazing or welding of the components on the support, wherein the memory cells are submitted to a temperature of at least 140° C. for at least 10 seconds. Preferably, the step of mounting comprises the application of a temperature higher than or equal to 260 degrees Celsius for at least 10 seconds.

Preferably, the step of mounting, typically WLCSP, comprises a step during which the memory cells are exposed to a temperature above 300° C. for several minutes. Preferably, the step of mounting comprises the application of a temperature higher than or equal to 300 degrees Celsius for at least 30 seconds. Preferably the step of mounting comprises applying a temperature ranging from 320° C. to 375° C. for a duration from 40 to 80 minutes.

Preferably, said second resistive state (LRS) is directly obtained by applying a voltage from the original resistive state (original HRS). According to one embodiment, said other resistive state LRS, programmed HRS) is said second resistive state (LRS). Such state is also called a conducting state or a low resistive state.

According to another embodiment, said other resistive state (LRS, programmed HRS) is a third resistive state (programmed HRS) wherein the resistance of the memory cell is at least twice, and preferably at least ten times lower than the resistance of the memory cell in the original resistive state (original HRS), The resistance of the memory cell in this third resistive state has a resistance different from and typically higher than that of the memory cell in the second resistive state (RLS). Preferably, programming the matrix by electrically bringing a memory cell from the original resistive cell (original HRS) to the third resistive state (programmed HRS) comprises the following steps, executed prior to mounting:

applying a voltage to the memory cell so as to bring the memory cell from the original resistive state (original HRS) to said second resistive state (LRS);

applying a voltage to the memory cell so as to bring the memory cell from the second resistive state (LRS) to the third resistive state (programmed HRS).

Preferably, bringing the memory cell in said third resistive state (programmed HRS) is a RESET operation.

Advantageously, in the third resistive state (programmed HRS) the memory cell has a resistance sufficiently higher than that of the memory cell in the second resistive state (LRS) for a reading circuit to be able to identify whether the cell is in the second resistive state (LRS) or in the third resistive state (programmed HRS).

In the third resistive state (programmed HRS), the memory cell has a resistance higher by at least a factor 2 than the resistance of the memory cell in the second resistive state (LRS) and, preferably by at least a factor 10.

The method comprises the following step of identification, executed after mounting the component containing said matrix on the support:

for at least a set of memory cells in the matrix, applying a voltage within a range of reading voltage having a lower amplitude than the first and second ranges;

if the cell has the resistance of the original resistive state (original HRS), deduce therefrom that the cell was in the original resistive state (original HRS) after programming and prior to mounting; otherwise, deduce therefrom that the cell was not in the original resistive state (original HRS) after programming and prior to mounting.

Then, after the pre-programming and prior to mounting, it may be decided to have one of the following couples in the same matrix of cells:

original resistive state (original HRS)/second resistive state (LRS). This couple has the advantage of having a very significant resistive difference between the two states, which enables a very reliable reading even with a relatively little accurate reading device.

original resistive state (original HRS)/third resistive state (programmed HRS). This couple has the advantage of having a very significant resistive difference between the two states.

According to a particular embodiment, after the step of programming and prior to mounting, said selected cells, i.e. the cells of said plurality of cells brought to the other resistive state, are in the second resistive state (LRS) or are in a third resistive state (programmed HRS) different from the second resistive state (LRS), wherein the resistance of the memory cell is at least twice, and preferably at least ten times lower than the resistance of the memory cell in the original resistive state (original HRS). Advantageously, at least one cycle of steps is carried out on said selected cells brought to the other resistive state (LRS, programmed HRS), with each cycle consisting in electrically bringing said selected cells in the matrix from a desired state among the second resistive state (LRS) and the third resistive state (programmed HRS) to the other one among such two states, and then in returning said cells to the desired state.

Advantageously, such RESET and SET cycles make it possible to check the resistive states at the end of the cycle, so that the correct operation of the selected cells can be checked. Besides, such sequences of RESET and SET operations reveal to be able to stabilize the conducting filament formed, too.

Several step cycles are preferably carried out. This makes it possible to check the correct operation of the cells with a better probability and to reinforce the stabilization of the conducting filament formed.

Advantageously, upon completion of at least one cycle of steps, the cells of said plurality of said are checked as being in the desired state, and, among the cells of said plurality of cells, the cells which are not in the desired state are identified.

Advantageously, the content of the identified cells is transferred to other memory cells. The information to be stored is thus stored in cells, the correct operation of which has been checked only.

The invention thus makes it possible to keep, after mounting, an identifiable voltage difference between, on the one hand, the memory cells which had been electrically modified prior to mounting, and, on the other hand, the cells which had not been electrically modified prior to mounting.

Depending on the various embodiments, it will be decided to modify or not, after mounting, the resistive state of the memory cells which had been electrically modified prior to mounting. Thus, the memory cells which were in the second resistive state (LRS) prior to mounting can, by applying a voltage after mounting, be brought to the third resistive state (programmed HRS).

As mentioned above, it will also be decided to modify or not, after mounting, the resistive state of the memory cells which had been electrically modified prior to mounting. The memory cells which were in the original resistive state (original HRS) prior to mounting will thus:

either all be kept in the original resistive state (original HRS), or all be brought to the third resistive state (programmed HRS), or all be brought to the second resistive state (LRS).

Care shall of course be taken that, after mounting, the cells left in the original resistive state during mounting are not, after mounting and after reprogramming, if any, in a similar resistive state to that of the other cells.

Then, during the operation of the cell, i.e. after mounting, it may be decided to have one of the following couples in the same matrix of cells:

original resistive state (original HRS)/second resistive state (LRS). This couple has the advantage of having a very significant resistive difference between the two states, which enables a very reliable reading even with a relatively little accurate reading device.

original resistive state (original HRS)/third resistive state (programmed HRS). This couple has the advantage of having a very significant resistive difference between the two states.

third resistive state (programmed HRS)/second resistive state (LRS).

Preferably, the resistances of the memory cells in the matrix which are in the original resistive state (original HRS) are included in a first range of values, the resistances of the memory cells in the second resistive state (LRS) are included in a second range of values, with the first and second ranges being separated at least for voltages included in said reading interval. Preferably the first and second intervals show a discrepancy of at least an order of magnitude, and preferably two orders of magnitude, at least for voltages included in said reading voltage interval. Preferably, the resistances of the memory cells in the third resistive state (programmed HRS) are included in a third interval of values, with the first and the third intervals being separated at least for voltages included in said reading interval. Preferably the first and second intervals show a discrepancy of at least an order of magnitude, and preferably two orders of magnitude, at least for voltages included in said reading interval. Preferably, the second and third intervals show a discrepancy of at least a factor 2, and preferably at least a factor 10 at least for voltages higher than said reading interval.

Advantageously, identifying whether each memory cell is in the original resistive state (original HRS) comprises: applying on each memory cell a voltage included in said reading interval and measuring the intensity of the current flowing through the memory cell, in order to deduce therefrom whether the resistance of such memory cell is included in the first range of values.

According to an advantageous embodiment, a number of memory cells higher than what is necessary for the information desired to be stored is provided for in the matrix, which thus defines test memory cells which are not intended to contain information to be stored and, prior to programming, tests are carried out on said test memory cells so that the first and second voltage ranges are determined. Voltages are thus applied to unused memory cells so as to identify the thresholds required for forming the conducting filament from the original resistive state (original HRS) and for re-forming the filament from the non-original non conducting state (SET step), i.e. the third resistive state (programmed HRS). The actual matrix is thus used to determine the intermediate voltage. Such embodiment enables a very accurate determination of the interval between the first and second ranges and the intermediate voltage.

Advantageously, switching from one resistive state to the other one is obtained by applying a voltage to the terminals of the conducting electrodes.

For instance, the state wherein the resistance of the cell is lower than or equal to 1.5 kilo-Ohms and preferably lower than 1,000 Ohms is called a conducting or low resistive state (LRS). Such resistance values may vary according to the applications. More generally, the state wherein the memory cell is when the conducting filaments are formed is called a conducting or low resistive state. More generally, a state wherein the memory cell has a resistance lower than the resistance it has in the non-conducting or resistive state is called a conducting state.

The state obtained prior to any application of a voltage aiming at modifying the resistivity of the memory cell is called an original resistive state (HRS). Typically, such original state is obtained after the formation of the dielectric layer and the electrodes.

Advantageously, this original state is obtained upon completion of the ultimate phases of the manufacturing process, which mainly consist in interconnecting the elementary components together, typically the memory cells with the card, and to the outside, using metal pads and connections, defined by photolithography. Such ultimate phases are generally called BEOL, the acronym for "Back-End Of Line", i.e. steps executed at the "end of the production line".

Generally, during such BEOL steps, the memory cells must resist temperatures which may reach 400° C., typically, for a few minutes, and even a few dozens of minutes.

Advantageously, the step of programming the matrix in order to electrically bring a set of selected cells from the original resistive state (original HRS) to the conducting or less resistive state (LRS) is executed after BEOL.

Advantageously too, during the step of mounting, a thermal stress smaller than the one applied during the BEOL steps, typically temperatures lower than those applied during the BEOL, is/are applied to the memory cells.

According to a not restrictive embodiment, the memory cells comprises two electrodes and a dielectric layer, which is positioned between the two electrodes, only. An interface layer may form naturally between the dielectric layer and at least one of the electrodes. Advantageously, such structure is easily produced and can be obtained very reliably. Preferably the memory cells comprise no phase-change material.

The dielectric is advantageously an oxide. The memory cell is advantageously of the OxRAM type.

The intermediate voltage is higher, in absolute value, than the reading interval, for a bipolar and unipolar operation. In bipolar operation, a negative voltage (or a reverse voltage relative to the forming voltage) must be applied to make an electric RESET.

In a unipolar operation, to make an electric RESET, it is sufficient to keep the same polarization and to increase the voltage relative to the voltages used for reading.

Another object of the invention is also a method for manufacturing a micro-electronic device comprising the steps of the pre-programming method.

Besides, the method preferably comprises at least one step of mounting a component on a support such as an electronic card, another component or a box.

The invention is applicable as well to the memory cells with a polarized operation as to the memory cells with a non polarized operation.

According to another embodiment, an object of the invention is a matrix of resistive non-volatile memory cells (RRAM) programmed using the method according to any one of the embodiments of the invention.

According to another embodiment, an object of the invention is a matrix of resistive non-volatile memory cells (RRAM) according to the invention, with at least some of the memories being of the random access memory type, with oxide (OxRAM).

According to another embodiment, an object of the invention is a micro-electronic device comprising a matrix of resistive non-volatile memory cells (RRAM) programmed using the method according to any one of the embodiments of the invention.

According to another embodiment, the object of the invention is also a micro-electronic device comprising a matrix of non volatile resistive memory cells comprising a dielectric material positioned between two conducting electrodes, with the cell being so configured that electric current flows through the dielectric material when the conducting electrodes are connected to an electric source, with the dielectric material being able to be electrically modified so as to bring the memory cell from an original resistive state (original HRS) corresponding to a first resistive state to at least another resistive state (LRS, programmed HRS) wherein the resistance of the memory cell is at least twice lower than the resistance of the memory cell in the original resistive state (original HRS), wherein the matrix is contained in a component, wherein the component is mounted on a support, characterised in that some cells of the matrix are in the original resistive state (original HRS) and in that the other cells are in a resistive state different from the original resistive state (original HRS).

Micro-electronic device means any type of device produced with micro-electronic means. Such devices more particularly concern, in addition to purely electronic purposes devices such as memories, micro-mechanical or electro-mechanical devices (MEMS, NEMS . . . ) as well as optical or opto-electronic devices (MEOMS . . . ).

According to another embodiment, the invention provides for a method for pre-programming a matrix of resistive non-volatile memory cells, with said memory cells comprising a dielectric material positioned between two conducting electrodes, and being able to electrically and reversibly bring the dielectric material from a non conducting state to a conducting or less resistive state (LRS) than the non conducting state, with the method comprising the following steps:
prior to mounting a component containing said matrix on a support,
  programming the matrix by electrically bringing a set of selected cells from an original non conducting state to a conducting state or less resistive state (LRS) than the non conducting state. The not selected memory cells are thus left in their original non conducting state.
The method further comprises the following step, after mounting the component containing said matrix onto a support:
  applying to all the cells in the matrix an intermediate voltage, with said intermediate voltage being lower than a first range of voltages having a value high enough to be able to bring the dielectric material from the original non conducting state to the conducting or less resistive state (LRS) and said intermediate voltage being higher than a second range of voltages having a value lower than the first range but being high enough to be able to bring the dielectric material to the conducting or less resistive state (LRS) from a non conducting state different from the original non conducting state and obtained further to the dielectric material being brought, beforehand, to the conducting or less resistive state (LRS).

According to another embodiment, the invention relates to a method for pre-programming a matrix of resistive non-volatile memory cells, with said memory cells comprising a dielectric material positioned between two conducting electrodes, with the method comprising the following steps:
prior to mounting a component containing said matrix onto a support, electrically forming in a set of selected cells in the memory matrix conducting filaments in the dielectric material positioned between the two electrodes;

leaving the not selected memory cells in their original non conducting state;

with the method further comprising, after mounting the component containing said matrix onto a support, A step of electrical re-programming of all the memory cells in the cell matrix so as to re-form the conducting filaments in the pre-programmed cells which might have been broken by the operation of mounting the component on the printed circuit.

Advantageously, the step of re-programming comprises applying to the set of the cells in the memory matrix an intermediate voltage between, on the one hand, a first range of voltages having values high enough to form the conducting filaments in the material from the original state thereof, and, on the other hand, a second range of voltages having lower values than the first range but however high enough to be able to re-form the conducting filaments already formed at least once.

BRIEF DESCRIPTION OF FIGURES

The goals and objectives as well as the characteristics and advantages of the invention will emerge better from the detailed description of an embodiment of this latter, illustrated by the following accompanying drawings in which.

The drawings attached are given as examples and are not limiting to the invention. These are schematic drawings intended to facilitate the understanding of the invention and are not necessarily at the same scale of the practical applications. More particularly, the relative thickness of the various layers and films are not a representation of reality.

DETAILED DESCRIPTION OF THE INVENTION

It should be noted that, within the scope of the present invention, the words "on", "lies above" or "under" or the equivalent thereof do not necessarily mean "in contact with". Thus, for instance, depositing a first layer on a second layer does not necessarily mean that both layers are directly in contact with each other, but this means that the first layer at least partially covers the second layer by being either directly in contact therewith or by being separated therefrom by another layer or another element.

Figure 1A:
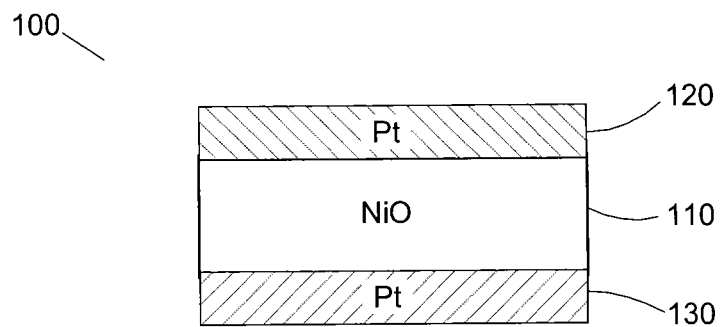
FIGS. 1a to 1c briefly disclose an exemplary RRAM memory of the OxRAM type and the operation thereof.
Figure 1B:
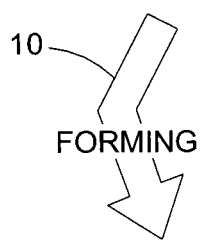
Figure 1B:
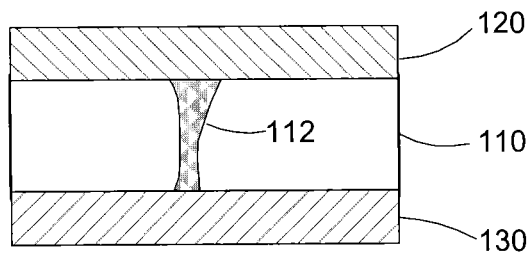
Figure 1C:
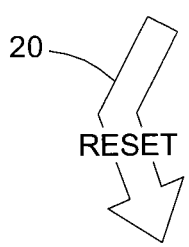
Figure 1C:
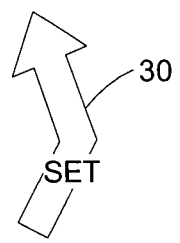
Figure 1C:
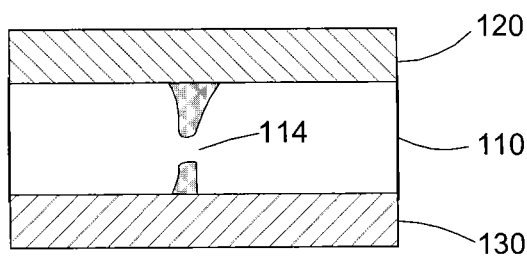

FIGS. 1a, 1b and 1c briefly disclose an exemplary resistive (RRAM) memory of the OxRAM type and the operation thereof. It should be noted here that the operating mode of other RRAM memories is similar thereto. These are for instance so-called CBRAM memories, the acronym for "Conductive Bridge Random-Access Memory", where, as shown by the name, "Conductive bridges" similar to the filaments described above are formed in a non conductive material. Such memories, as well as other ones, based on the same principles, are also liable to take advantage of the invention and the invention is limiting none of the resistive memory types.

It should be noted here that the invention is liable to be applied to whatever mechanism implemented by the non volatile memory considered, more especially if the voltage range applied to initially form a conducting path, whatever form it takes, from its original state after manufacture, is clearly differentiated from the voltage range required for its re-forming (SET) when utilizing of the device, as illustrated later in FIG. 3.

FIG. 1a illustrates the structure of a memory cell OxRAM 100 wherein the dielectric material 110 is, in this example, nickel oxide (NiO) comprised between two metal electrodes, 120 et 130, made of platinum (Pt).

FIG. 1b illustrates the initial forming of a conducting filament 112 resulting from the application, between the two metal electrodes, of a suitable voltage, which depends, among other things, on the nature of the materials used, as will be seen in FIG. 2.

It should be noted here that the physico-chemical phenomena leading to the forming of a conducting filament 112 resulting from the application of a sufficient electric voltage on the electrodes and the very nature of the filament, are not yet understood by the scientific community working in this field. Various mechanisms have been considered to explain the forming of the filaments which include the presence of flaws and the migration of the metal composing the electrodes. However, as shown in FIG. 1b, during a first step 10, the initial forming of at least one conducting filament 112 or a conducting path, of any kind, by applying a sufficient potential difference between the two electrodes 120 and 130.

The memory cells according to the invention have several states which correspond, each to a level of electric resistance of the cell. Three states can thus be counted:

an original resistive state, also called the original non conducting state or the original highly resistive state. In the present patent application, this state is also called the original HRS, the acronym for original highly resistive state. This state is also called the first resistive state.

Original non conducting state refers to the state obtained prior to any application of a voltage aiming at modifying the resistivity of the memory cell. Such original state is obtained after the formation of the dielectric layer and the electrodes. Advantageously, this original state is obtained upon completion of the ultimate phases of the manufacturing process, which mainly consist in interconnecting the elementary components, typically the memory cells with the card, and to the outside, using metal pads and connections, generally defined by photolithography. Such ultimate phases are generally called BEOL, the acronym for "Back-End Of Line", i.e. steps executed at the "end of the production line". Generally, during such BEOL steps, the memory cells must resist temperatures which may reach 400° C., typically, for a few minutes, and even a few dozens of minutes. Advantageously, the step of programming the matrix in order to electrically bring a set of selected cells from an original non conducting state to a conducting or at least a resistive state (LRS) is executed after BEOL. Advantageously too, during the step of mounting, a thermal stress smaller than the one applied during the BEOL steps, typically temperatures lower than those applied during the BEOL, is/are applied to the memory cells.

In this state, the information binary coded by the cell is for example a "0".

a conducting or low resistive state, also called a low resistive state. This state is also called the second resistive state. To be brief and clear in the present patent application, this state is also called the LRS state. LRS is the acronym of low resistive state. This LRS state is obtained by applying a voltage to the memory cell in the original HRS state. This state is thus obtained directly from the original resistive state (original HRS).

The increase in conductivity in this LRS state can be explained by the forming of filaments. More generally, a state is called a conducting state, when the memory cell has a resistance lower than the resistance it has in a non-conducting or resistive state. As a non-restricting example, a state wherein the resistance of the cell is lower than or equal to 1.5 kilo-Ohms and preferably lower than 1,000 Ohms can be called a conducting or electrically low resistive state. Such resistance values may vary significantly according to the applications and/or the structure and the composition of the memory cell.

In this state, the information binary-coded by the cell in the LRS state shall be, for instance, "1" if the information coded by the cell in the original HRS state is a "0". On the contrary, the information binary-coded by the cell in the LRS state shall be, for instance, "0" if the information coded by the cell in the original HRS state is "1".

a programmed resistive state or programmed highly resistive state or programmed high resistance state. This state is also called the third resistive state. To be brief and clear in the present patent application, this state is also called the "programmed HRS" state. This HRS state is obtained by applying a voltage to the memory cell in the original LRS state. The resistance of the memory cell in this programmed resistive state is however always lower than the resistance of the cell in the original highly resistive HRS state (original HRS).

The operation consisting in bringing the memory cell from the LRS state to the programmed HRS state is usually called the RESET operation. According to the applications, it may be considered that a memory cell in the programmed HRS state carries the "0" information if the cell in the LRS state carries the "1" information, or conversely, that the memory cell in the programmed HRS state carries the "1" information if the cell in the LRS state carries the "0" information.

The original HRS, LRS and programmed HRS states have different resistances. More precisely, the resistances of the cells in the original HRS state must be clearly differentiable from the resistance of the cells in the programmed HRS state or in the LRS state, and this is true for all the cells in the device.

According to the type of OxRAM memory considered, of which FIG. 1 is only one example, two different operating modes can be noted:

One is unipolar and not polarized. This means that the operations of forming or re-forming a conducting filament or SET, and of breaking the filament or RESET, are not dependent on the polarity of the applied voltage.

The other one is bipolar or polarized. The SET and RESET operations are executed with opposed polarities.

Whatever the operating mode, FIG. 1c illustrates the breaking 114 of the filament which is obtained upon completion of a RESET operation 20 which places or re-places the memory cell in a high resistance (programmed HRS) state. The re-forming 112 of the filament is obtained upon completion of a SET operation 30. The memory cell is then again in a low resistive state (LRS) and it was noted above that this state was thermally unstable.

FIGS. 2a to 2d illustrate other exemplary RRAM memories using different dielectric material and electrode structures. The invention is not limited to these other examples and extends to many other memory cells structures complying with the above-mentioned conditions to execute the resistivity modification operations.

Figure 2A:
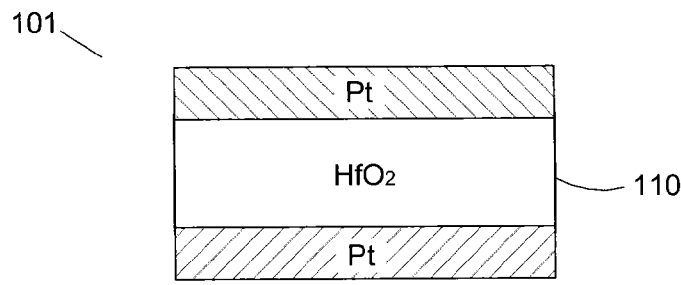
FIGS. 2a to 2d illustrate other exemplary RRAM memories using different dielectric material and electrode structures.

FIG. 2a shows a first structure 101 similar to that of FIG. 1a, wherein the dielectric material 110 is then made of hafnium oxide (HfO2). It should be noted that the scientific community has reached a consensus and come to the conclusion that the conducting state or low resistive state of a memory cell made of hafnium oxide is obtained because oxygen vacancies and the related aggregation are formed.

HfO2, the related results being shown in FIG. 3, is deposited by ALD, the acronym for <<atomic layer deposition>> i.e. <<deposition of atomic layers>> in a specialized device, under the following conditions:

deposition temperature: 350° C.;

pressure: 1 Torr;

precursor gases: Vapor phase Hafniumtetrachloride (HfCl4) and water (H2O), sent in separate cycles onto the wafer. A complete cycle is composed of: one pulse of HfCl4, one nitrogen (N2) draining, one pulse of H2O, 1 nitrogen draining.

180 cycles are necessary to grow 10 nm of HfO2.

The list of materials wherein conducting filaments are liable to grow potentially comprises, in addition to the above-mentioned nickel and hafnium oxides, the following materials: all oxides which operate according to the same model, i.e. from the forming of oxygen vacancies.

Such FIGS. 2a-2d clearly show that the dielectric material 110 is positioned in the current flow. The current flowing from one electrode 120, 130 to the other electrode must necessarily go through this dielectric material 110. As illustrated in these figures, the dielectric material 110 is in contact with each one of the two electrodes 120, 130. No other material is provided between the dielectric material 110 and the two electrodes 120, 130 when producing the cell.

Figure 2B:
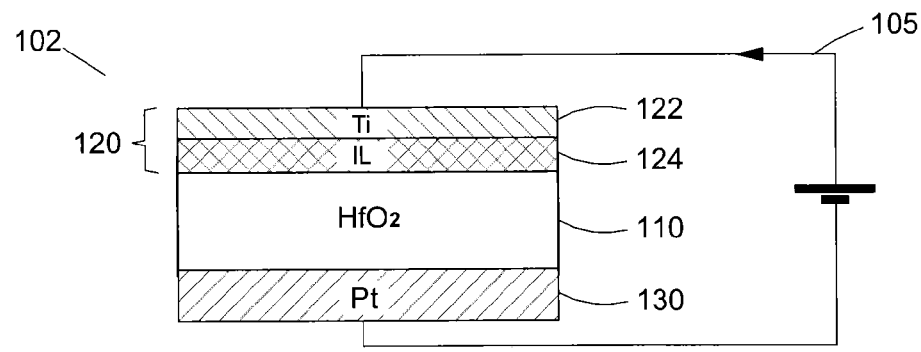

FIG. 2b illustrates a second structure 102 of a memory cell wherein the upper electrode 120 is different from the lower electrode 130. More particularly, the upper electrode comprises one layer 122 made of titanium (Ti) and possibly another layer. Said another layer constitutes an interface layer 124 with hafnium oxide 110. This is a layer of HfO2 stoichiometric in oxygen. It is designated by the acronym "IL" for "interface layer". The layer 124 is formed naturally, because of titanium (Ti) in the layer 122 which absorbs the oxygen in the layer 110 made of HfO2. The layer 124 is not intentionally deposited. The layer 122 only constitutes the upper electrode proper, a part of titanium of which will melt with HfO2, as per the above mentioned phenomenon. In the structure shown in FIG. 2, the lower electrode 130 is made of platinum, as before. In FIG. 2b, and in the following asymmetric structures, the positive voltages are applied as indicated by reference 105.

Figure 2C:
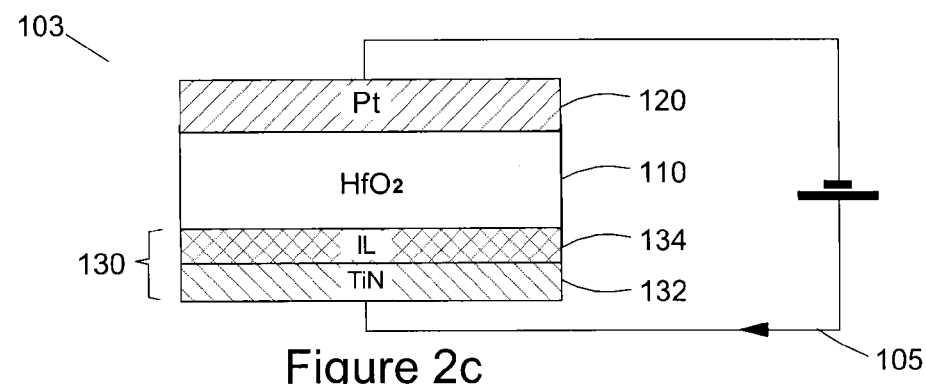

FIG. 2c illustrates a third structure 103 of a memory cell wherein the upper electrode 120 remains in platinum. In this case, the lower electrode 130 comprises two layers. The layer 134 is identical to the interface layer (IL) described above. The layer 132 is made of titanium nitride (TiN).

Figure 2D:
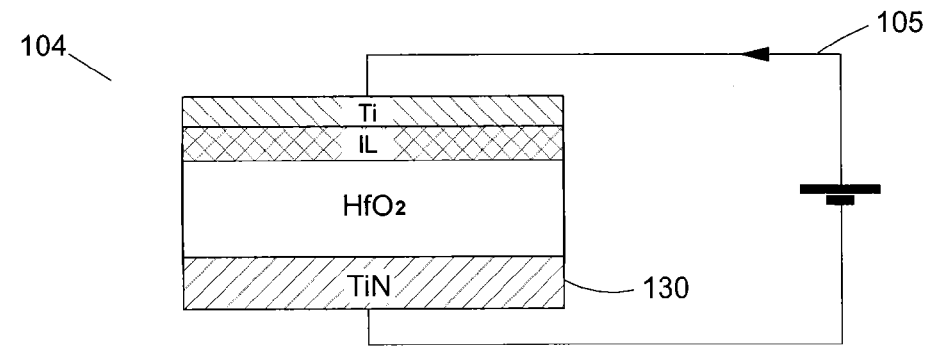

FIG. 2d illustrates a fourth structure 104 of a memory cell which is similar to the structure 102 disclosed in FIG. 2b. The difference lies in that the lower electrode 130 is then made of titanium nitride (TiN) instead of platinum.

The experimental results obtained with such structures are summarized in the following table:

| Reference of the structure (FIGS. 2a to 2d) | Voltage in volts for forming a filament from the original state | Voltage in volts applied during a SET operation | Voltage in volts applied during a RESET operation | Resistance in Ohms after a SET operation | Resistance in Ohms after a RESET operation |
|---|---|---|---|---|---|
| Polarized operation mode | | | | | |
| 101 | 4.7 ± 0.3 | 3 ± 1.5 | −0.3 ± 0.1 | ~600 | 1 × 10$^6$ to 100 × 10$^6$ |
| 102 | 1.35 ± 0.58 | 0.85 ± 0.2 | −0.8 ± 0.1 | ~800 | 10 × 10$^3$ to 1 × 10$^6$ |
| 103 | 4.4 ± 0.3 | 1.3 ± 0.8 | −1.1 ± 0.4 | ~1,000 | 10 × 10$^3$ to 1 × 10$^6$ |
| 104 | 1.90 ± 0.14 | 0.45 ± 0.1 | −0.43 ± 0.2 | 400 | 6 × 10$^3$ to 20 × 10$^3$ |

It should be noted that such values are experimental ones and that they may vary from one batch to another one. Additionally, it should be noted that the experimental structures used for defining such values have no series selector element like a standard memory cell.

Figure 3A:
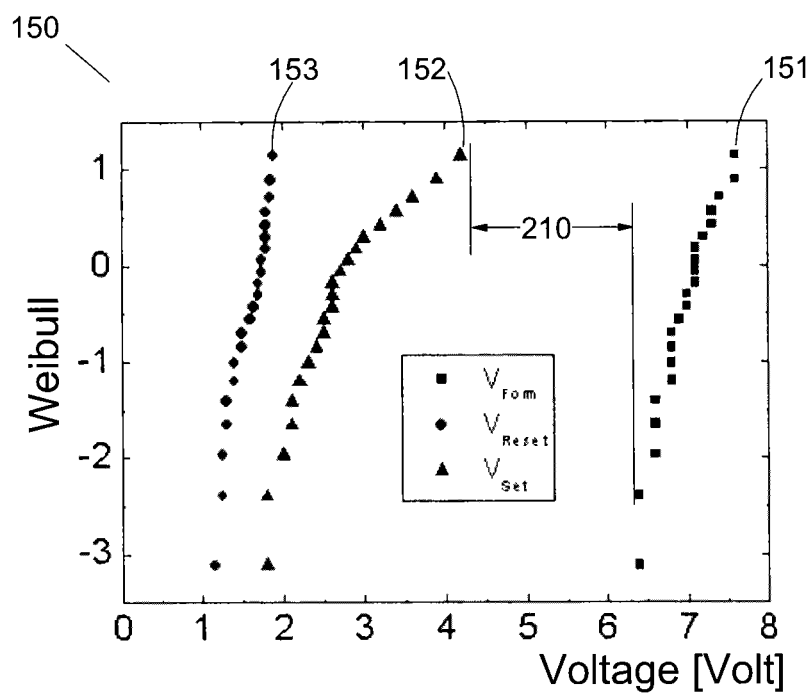
FIGS. 3a to 3c illustrate the criterion which allows the pre-programming method according to the invention to be implemented in the memory of the OxRAM type.
Figure 3B:
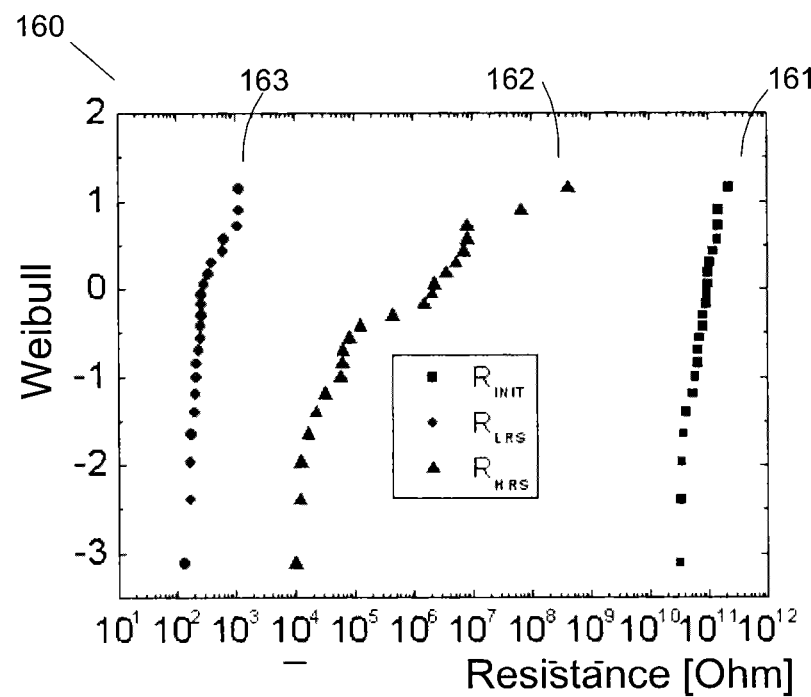

FIGS. 3a and 3b show other experimental results relating to the non polarised operation mode of the structure 101 illustrated by FIG. 2a. In this case, the layer of the hafnium oxide has a thickness of 20 nm.

In diagram 150, FIG. 3a shows, for a batch of devices corresponding to structure 101, the distributions of the Weibull type: voltages for forming 151 a filament or a conducting path from the original state of the deposited material; RESET 153 voltages to break the filament and SET 152 voltages to re-form it. It should be noted here that the SET 152 and filament forming 151 distributions are separated 210.

In diagram 160, FIG. 3a shows, for the same batch of devices, the distributions of the resistances of the cells in the various states: in the original state of the material 161, after an operation of breaking the filament (RESET) 162 where the state is called HRS, and after an operation of re-forming the filament (SET) 163 where the state is called LRS.

The invention is based on the fact that it is possible, as explained in the following Figures, to usefully pre-program those of the memories corresponding to FIGS. 2a to 2d for which the SET voltage range does not overlap the one required for forming a filament 112 from the original state of the material 110. In the table above, the structures 103 and 104 meet this criterion. This is also true for the not polarised structure 101 in FIG. 3a. As a matter of fact, the pre-programming method disclosed hereunder will make it possible to restore the pre-programmed information after a significant rise in the temperature (generated during a step of welding or brazing, for instance), provided that the above criterion is fulfilled.

Figure 3C:
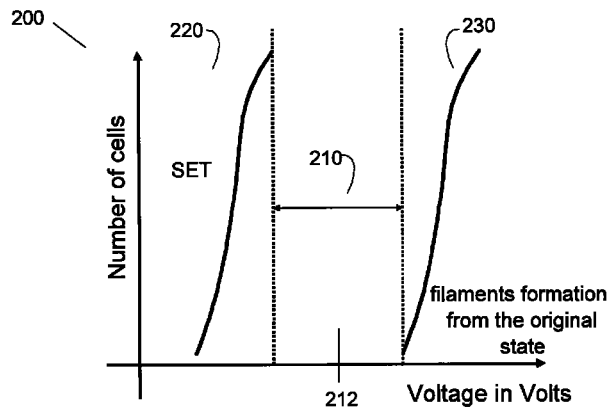

FIG. 3c shows this criterion in diagram 200 by indicating that the populations of cells existing on a wafer must be sufficiently separated, as beforehand, in FIG. 3a, for enabling to define an intermediate voltage 212, between the two distributions 220 and 230, which ensures that all the cells will be able to stand a SET operation without the cells wherein the material stayed in its original state being able to reach a conducting or little resistive state since the applied voltage 212 will then be insufficient. As a matter of fact, applying the intermediate voltage 212 does not enable to form a conducting filament in the memory cells which are in the original resistive state (original HRS). It is reminded here that the original resistive state (original HRS) also referred to as the original non conducting state is the state obtained prior to any application of a voltage aiming at modifying the resistivity of the memory cell.

Typically such original state is obtained after the formation of the dielectric layer and the electrodes.

The non overlapping of the first 220 and second 230 ranges is shown in FIGS. 3a and 3c by the interval 210.

A minimum of 100 millivolts, preferably at least 200 millivolts and more preferably at least 500 millivolts must separate the first 220 and second 230 ranges of voltage. It should be noted here that the persons skilled in the art know how to make a diagram 200 like the one in FIG. 3 by making a previous characterisation of the technology used on wafers representative thereof. Optionally, tests can also be made on unused parts of memory matrices which must be pre-programmed to evaluate the amplitude of both distributions, 220 and 230, identify the presence of an intermediate interval 210 and determine the optimum writing threshold 212 of the set of cells after the rise in temperature (welding, for instance) which will make it possible to retrieve the pre-programmed information as explained hereunder. If the set of information to be saved in the matrix requires a number of memory cells lower than the number of the memory cells in the matrix, a part of the memory cells which are not used for saving the information is thus advantageously used to identify the two distributions 220 and 230. Voltages are thus applied to unused memory cells so as to identify the thresholds required for forming the conducting filament from the original resistive state (original HRS) and for re-forming the filament from the non-original non conducting state (SET step).

Figure 4A:
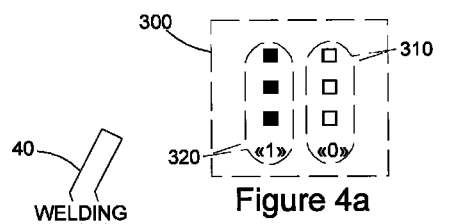
FIGS. 4a to 4c illustrate the programming method according to the invention.
Figure 4B:
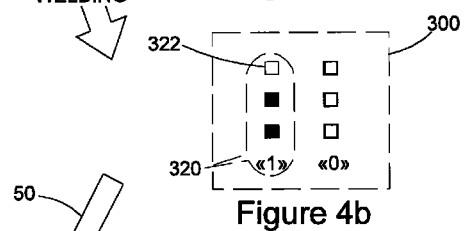
Figure 4C:
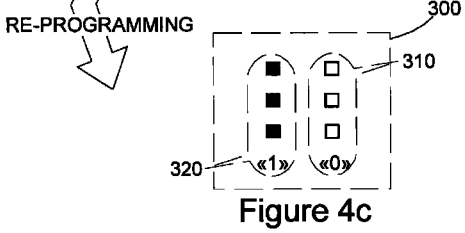

FIGS. 4a, 4b and 4c illustrate the pre-programming method of the invention which may be applied when the conditions described in the preceding figures are fulfilled.

FIG. 4a illustrates the step of pre-programming which is executed on each memory matrix 300 typically contained in an electronic chip wherein information is desired to be stored. In the context of the invention, the storage is advantageously executed, for the reasons enumerated in the State of the Art section, at the end of the chips manufacturing cycle, prior to mounting on a printed circuit constituting the whole or a part of an embedded system, whereon they will be exposed to the temperatures generated by the reflow soldering of the components. The electrical pre-programming at the end of the programming cycle may be executed using the conventional means developed by the micro-electronics industry. Pre-programming may more particularly be executed using suitable electro-mechanical tooling on all the chips contained on a wafer prior to cutting the latter or on each chip, separately, after cutting the wafer.

Whatever the stage of production during which pre-programming is executed, and whatever the means used, the invention provides that information can be pre-programmed in two forms:

- a set of memory cells 310 is left in the original state, i.e. the state resulting from the production cycle. No electric signal is applied to these cells, which might modify the physico-chemical structure thereof. As a matter of fact, the voltages which may be applied are always far lower than the voltages applied to form the conducting filaments. The cells in this set are therefore in its original HRS state in a high resistance.
- Another set of memory cells 320, generally the complementary set of the memory matrix 300 desired to be pre-programmed, is selected, wherein conducting filaments will be electrically formed, as explained above, on each cell. These memory cells will then be put in a low resistive state (LRS). It should be noted that all the memory cells of the memory matrix of a chip desired to be pre-programmed for a particular application may not be, or are often not used in practice. Depending on the specific embodiments of the invention, the memory cells which are not used by the application may be used as test cells, as already mentioned for the preceding Figure. They can be left in the original state or on the contrary, be placed intentionally in the LRS state, as well.

It should be noted here that the "0" and "1" figures are currently used to refer to the binary state of a memory cell. In the field of the invention, "0" is generally associated with the programmed HRS state. This is the state in a high resistance to be detected by a reading circuit (not shown) of the matrix in the form of an absence of current, or of a current remaining sufficiently weak not to be detected by the latter. On the contrary, in the LRS state, the reading circuit can detect a higher current flow and this state is generally associated with figure <<1>>. This most often used convention is also used in the following description of the present invention. The opposite convention could however be used as well. In the ordinary language shared by all those who work in this field, the step of pre-programming thus consists in programming "1"s, i.e. low resistance values, in a set of memory cells which is specific to a given application. The other cells are left in their original highly resistive state, i.e. in the "0" state.

FIG. 4b illustrates the effect of an application of heat on the memory matrices 300. Typically and as mentioned above, this additional heat is typically brought by the step of mounting the component containing the matrix of memory cells on a support such as an electronic card, a box encapsulating the component or another component. Such mounting operation comprises, for instance, a step of reflow soldering 40.

As seen, the pre-programmed "1" state is thermally unstable. At least some cells 322, or even all of them in the set 320, are liable to be affected by a temperature which may reach, as mentioned typically 260° C., for a time of about 2 minutes. For example, the filaments 112, which have been formed for pre-programming shall then be partially broken 114, as after a RESET operation.

FIG. 4c illustrates the result of the step of the invention which provides that, after mounting pre-programmed chips on their printed circuits, and thus after the step of adding a large quantity of heat (for instance during welding), all the pre-programmed memory matrixes contained in these chips are "re-programmed" again by utilizing this time the new intermediate electrical level 212 as defined in FIG. 3.

It should be noted that this step of re-programming 50 which is executed only once after mounting, does not require to know the specific pre-programming which has been used at the end of the production line. As a matter of fact, this characteristic step of the invention provides that all the memory cells of a pre-programmed memory matrix are systematically browsed to be re-programmed with the intermediate electrical level 212.

Under these conditions, the cells 310 which had been left in their original state will not at all be affected since the applied re-programming voltage 212 is not sufficient to change this state, as seen above. On the contrary, applying the re-programming voltage to the cells 320 wherein a conducting filament has already been formed will re-form the filaments which have been partially broken upon completion of the welding, like for the SET operation. The low resistive state LRS is recovered and the pre-programming is then totally restored. The reading circuits can again distinguish the pre-programmed "1" levels from the "0" levels.

Referring to the structure 103 disclosed in FIG. 2c, the values noted in the line corresponding to the previous table show that a pulse of re-programming voltage having an intermediate value 112, for instance of 3 volt, can be suitable since it is lower than the lowest value required to form a filament, i.e. 4.4−0.3=4.1 volts and it is higher than the highest value required for a SET operation, i.e. 1.3+0.8=2.1 volt. In this example, the layer of $HfO_2$ can be provided with a thickness of approximately 10 nm to be deposited by atomic layers deposition (ALD).

However, it should be noted that insofar as the distribution of voltages required to bring the cell to the second resistive state (LRS) i.e., the conducting state (for example by forming filaments), i.e. the range 230 in FIG. 3c, is characterized for a given memory cell technology and structure, an intermediate re-programming voltage 112 after welding, which is as close as possible to the lower end of this range, should be preferably used in order to guarantee the reliability of the step 50 of re-programming, i.e. all the SET operations which replace the cells in their second resistive state (LRS) after they have been brought to their resistant state after welding (SET operations which re-form the filaments which have been broken after welding).

The pre-programming method described above can unrestrictedly apply to the OXRAM memories, the operating mode of which is a so-called polarised or bipolar operation.

In the case of memories wherein the operation is not polarized, like the one of structure 101, the method of the invention becomes as follows:

The cells which had been left in their original "0" state will not at all be affected since the applied re-programming voltage is not sufficient to change this state, as seen above.

On the contrary, applying the re-programming voltage to the cells wherein a conducting filament has already been formed will re-form the filaments which have been partially broken upon completion of the welding, like for the "1" SET operation. The low resistive state LRS is recovered and the pre-programming is then totally restored. The reading circuits can again distinguish the pre-programmed "1" levels from the "0" levels.

The memory cells which, during the programming prior to the thermal stress, have been brought to the "1" SET state and which remain therein after the thermal stress will also be in the LRS state after the application of the intermediate voltage. More precisely, such memory cells will first be submitted to a RESET (the voltage threshold required for the RESET operation being reached), then a SET operation (the threshold voltage for the execution of this SET operation being reached then since the applied intermediate voltage is higher than the SET voltage). The resistive state prior to and after re-programming is identical.

In an advantageous option, it should be noted that the cells pre-programmed with "1" prior to applying the thermal stress (typically corresponding to a step of welding) can be pre-programmed several times by executing RESET and SET cycles, so as to make sure they actually are functional. Such SET and RESET operation sequences also aim at stabilizing the conducting filament which has been formed. Advantageously, the cells which would prove to be not complying with the specifications, for instance, having particularly high or dispersed SET values, can be declared non functional. They will not be used but will be replaced by other functional cells. The contents thereof shall then be transferred by implementing the redundancy techniques developed for other types of memories like the so-called FLASH memories which may be used with individual cells, non functional cells or even pages.

No SET and RESET operations cycles will be executed on the cells which have not been returned to the conducting or low resistive state (i.e., the second resistive state LRS) and which remain in the original resistive state (original HRS). Their non conducting state is thus kept. However, it may be checked that the cells actually are in a high resistance state.

The above description more particularly discloses embodiments wherein the step of mounting is executed by welding or brazing. The invention also extends to embodiments wherein the mounting of the component containing the matrix of memory cells on a support is executed using the so-called WLCSP (Wafer Level Chip Scale Packages) technique.

Such mounting technique has been developed by the micro-electronics industry to enable the mounting of the components belonging to an embedded system on one or more printed circuits. This technique relies on the deposition, onto the component to be mounted, of a layer of photodefinable polymeric material, for instance a polyimide material, i.e. a polymeric material containing one or more imide groups in its main chain, or polybenzobisoxazole, also called PBO. As these materials are photodefinable, the layer thus deposited can be etched by being exposed to a suitable light stimulus followed by a development. A metal ball may then be placed in the cavity which has just been obtained. This ball is responsible for the mechanical and electrical contacts between the component to be mounted and the corresponding printed circuit(s).

In some cases, the deposit of a metal layer, for example of copper, called a ReDistribution Layer or RDL, which is etched, is substituted for the metal ball deposit. Such RDL layer is then encapsulated using a photodefinable polymeric material which is, in turn, etched by being exposed to a suitable light stimulus and a development. This ball which is responsible for the mechanical and electrical contacts between the component to be mounted and the corresponding printed circuit(s) is then placed in the cavity which has just been obtained.

In some cases, the deposition of the metal ball is preceded by obtaining a so-called UBM (for Under Bump metallurgy) metal layer, made of Copper or Nickel-based (refer to the Figures hereunder).

The layer(s) of the polymeric material must often be obtained using a method including steps of high temperature annealing. An example of the main steps required for obtaining a layer of polymeric material which may be used in the mounting techniques described above is provided in the following:

Preparation of the substrate: T° 80° C.-200° C.—Duration: 60-240 seconds (s)

Soft bake: T° 120° C.—Duration: 180 s

Nitrogen curing (HD2280):
Temperature increase: 25° C.→150° C. with a gradient of 4° C./min
Temperature increase: 150° C.→320° C. with a gradient of 2.5° C./min
Temperature hold: 320° C. for 1 hour
Progressive cooling to ambient temperature The above-mentioned indications relate to another example of nitrogen curing (HD-4100):
Temperature increase: 25° C.→200° C. with a gradient of 10° C./min
Stand-by at 200° for 30 min
Temperature increase: 200° C.→375° C. with a gradient of 10° C./min
Temperature hold: 375° C. for 1 hour
Progressive cooling to ambient temperature Therefore, these methods thus comprise at least a step at a temperature above 240° C., often above 300° C. and most often between 320° C. and 375° C. for several dozens of minutes, typically 60 minutes.

The invention makes it possible to retrieve, after the step at a very high temperature, the data saved prior to mounting.

The invention is not limited to the embodiments described but applies to any embodiment complying with the spirit of the claims.

Particularly, although in the detailed description illustrating the Figures, the case where the cells, prior to mounting, are either in the original state (original HRS), or in the second resistive state (LRS) is mainly considered, the invention more particularly covers the cases where the cells, prior to mounting, are brought from the second resistive state (LRS) to the third resistive state (programmed HRS).

As a matter of fact, depending on the embodiments, it may be decided to modify or not, prior to mounting, the resistive state of the memory cells which had been brought to the second resistive state (LRS) from the original resistive state (original HRS). The memory cells which were in the second resistive state (LRS) prior to mounting thus can, still prior to mounting, either be all left in the second resistive state (LRS) or be brought to the third resistive state (programmed HRS) by applying a voltage.

The original HRS/LRS couple has the advantage of requiring only one programming of the cells.

The invention claimed is:

1. A method for pre-programming a matrix of resistive non-volatile memory cells, with said memory cells comprising a dielectric material positioned between two conducting electrodes, with said memory cells being initially in an original resistive state (original HRS) corresponding to a first resistive state and the dielectric material being able to be so electrically modified as to bring the memory cell from the original resistive state (original HRS) to at least another resistive state (LRS, programmed HRS) wherein a resistance of the memory cell is at least twice lower than the resistance of the memory cell in the original resistive state (original HRS), wherein the method comprises:

prior to mounting a component containing said matrix on a support:
programming the matrix by electrically bringing a plurality of cells from the original resistive state (original HRS) to said other resistive state (LRS, programmed HRS); leaving the other memory cells in their original resistive state (original HRS);

and wherein the method comprises, after mounting the component containing said matrix on the support:
applying to all the cells in the matrix an intermediate voltage, with said intermediate voltage being:
lower than a first range of voltages having a value high enough to be able to bring a memory cell from the original resistive state (original HRS) to a second resistive state (LRS) wherein the resistance of the memory cell is at least twice lower than the resistance of the memory cell in the original resistive state (original HRS), with the intermediate voltage being sufficient to modify the resistive state of the cells which had been left in their original resistive state (original HRS) during the programming executed prior to mounting;

higher than a second range of voltages having values lower than the first range but high enough to be able to bring a memory cell which is not in the original resistive state (original HRS) to said second resistive state (LRS), with the first and second ranges of voltage being separated.

2. The method according to claim 1, wherein the first and second ranges of voltage are separated by an intermediate interval of values, with said intermediate interval of values being greater than or equal to 100 millivolts.

3. The method according to claim 2, wherein said intermediate interval of values is greater than or equal to 500 millivolts.

4. The method according to claim 1, wherein the intermediate voltage is so selected as to be as high as possible within an intermediate interval of values.

5. The method according to claim 1, wherein during the mounting, the memory cells being exposed to a temperature of at least 240° C.

6. The method according to claim 1, wherein the mounting comprises applying to the matrix a temperature higher than or equal to 240° C. for at least 10 seconds.

7. The method according to claim 1, wherein the mounting comprises brazing or welding the component on the support or mounting using a wafer level chip scale packaging technique (WLCSP).

8. The method according to claim 1, wherein the mounting the component containing said matrix on the support comprises mounting the component onto a printed card, an electronic card, another electronic component or a box.

9. The method according to claim 1, wherein said second resistive state (LRS) is directly obtained by applying a voltage from the original resistive state (original HRS).

10. The method according to claim 9, wherein said other resistive state (LRS, programmed HRS) is said second resistive state (LRS).

11. The method according to claim 9, wherein said other resistive state (LRS, programmed HRS) is a third resistive state (programmed HRS) wherein the resistance of the memory cell is at least twice lower than the resistance of the memory cell in the original resistive state (original HRS), wherein the resistance of the memory cell has a resistance different from that of the memory cell in the second resistive state (LRS) and wherein electrically bringing a memory cell from the original resistive state (original HRS) to the third resistive state (programmed HRS) comprises the following steps, which are executed prior to mounting:

applying a voltage to the memory cell so as to bring the memory cell from the original resistive state (original HRS) to said second resistive state (LRS);

applying a voltage to the memory cell so as to bring the memory cell from the second resistive state (LRS) to the third resistive state (programmed HRS).

12. The method according to claim 11, wherein bringing the memory cell to said third resistive state (programmed HRS) is a RESET operation.

13. The method according to claim 11 wherein, in the third resistive state (programmed HRS) the memory cell has a resistance higher than that of the memory cell in the second resistive state (LRS) so that a reading circuit can identify whether the cell is in the second resistive state (LRS) or in the third resistive state (programmed HRS).

14. The method according to claim 13, wherein, in the third resistive state (programmed HRS), the memory cell has a resistance higher by at least a factor 2 than the resistance of the memory cell in the original resistive state (original HRS).

15. The method according to claim 1, wherein after the programming and prior to mounting, the cells of said plurality of cells are in the second resistive state (LRS) or are in a third resistive state (programmed HRS) wherein the resistance of the memory cell is at least twice lower than the resistance of the memory cell in the original resistive state (original HRS), and wherein at least a cycle of steps is carried out on said cells of said plurality of cells brought to the other resistive state (LRS, programmed HRS), with each cycle consisting in electrically bringing said memory cell of said plurality of cells from a desired state among the second resistive state (LRS) and the third resistive state (programmed HRS) to the other one among these states and then in returning said cells to the desired state.

16. The method according to claim 15, wherein several step cycles are executed.

17. The method according to claim 15, wherein, upon completion of at least one cycle of steps, the cells of said plurality of said cells are checked as being in the desired state, and, among the cells of said plurality of cells, the cells which are not in the desired state are identified.

18. The method according to claim 17, wherein the content of said identified cells is transferred to other memory cells.

19. The method according to claim 1, wherein a number of memory cells higher than what is necessary for information desired to be stored is provided for in the matrix, which thus defines test memory cells which are not intended to contain information to be stored and, prior to programming, tests are carried out on said test memory cells so that the first and second voltage ranges are determined.

20. The method according to claim 1, wherein all current flowing through the two conducting electrodes goes through the dielectric material.

21. The method according to claim 1, wherein the dielectric material is in contact with each one of the two conducting electrodes.

22. The method according to claim 13, wherein, in the third resistive state (programmed HRS), the memory cell has a resistance higher by at least a factor 10 than the resistance of the memory cell in the original resistive state (original HRS).

* * * * *